US012719256B2

(12) United States Patent
Brown

(10) Patent No.: US 12,719,256 B2
(45) Date of Patent: Aug. 25, 2026

(54) ARC FAULT DETECTION USING ULTRASONIC ACOUSTIC SENSORS

(71) Applicant: Guardhouse Fire Solutions, LLC, Miami, FL (US)

(72) Inventor: James L. Brown, San Clemente, CA (US)

(73) Assignee: Guardhouse Fire Solutions, LLC, Miami, FL (US)

( * ) Notice: Subject to any disclaimer, the term of this patent is extended or adjusted under 35 U.S.C. 154(b) by 0 days.

(21) Appl. No.: 19/275,673

(22) Filed: Jul. 21, 2025

(65) Prior Publication Data

US 2026/0024982 A1 Jan. 22, 2026

Related U.S. Application Data

(63) Continuation of application No. PCT/US2025/038338, filed on Jul. 18, 2025.

(60) Provisional application No. 63/674,169, filed on Jul. 22, 2024.

(51) Int. Cl.
*H02H 1/00* (2006.01)
*G01R 31/12* (2020.01)

(52) U.S. Cl.
CPC ....... *H02H 1/0023* (2013.01); *G01R 31/1209* (2013.01)

(58) Field of Classification Search
CPC .......................... H02H 1/0023; G01R 31/1209
USPC .................................. 324/500, 537, 764.01
See application file for complete search history.

(56) References Cited

U.S. PATENT DOCUMENTS 8,310,800 B1 * 11/2012 Williams ................. H01C 7/12 361/131
10,333,290 B2 * 6/2019 Beierschmitt .......... H02H 3/334
10,890,610 B2 * 1/2021 Gondi ................ G01R 31/3171
12,174,251 B2 * 12/2024 Kusko ................ G01R 31/3183
2006/0164097 A1 7/2006 Zhou et al.
2008/0106832 A1 5/2008 Restrepo et al.
2014/0188467 A1 7/2014 Jing et al.
2018/0074112 A1 3/2018 Alberto et al.
2021/0278453 A1 9/2021 Denney
2024/0204724 A1 6/2024 Farhangi et al.
2024/0255572 A1 * 8/2024 Chughtai ............... G01R 13/02
2024/0426890 A1 * 12/2024 Robinson ............. G01R 31/086

OTHER PUBLICATIONS

Search Report and Written Opinion issued in International Application No. PCT/US2025/038338, dated Sep. 17, 2025.

* cited by examiner

*Primary Examiner* — Giovanni Astacio-Oquendo
(74) *Attorney, Agent, or Firm* — KNOBBE, MARTENS, OLSON & BEAR, LLP

(57) ABSTRACT

A device may include an acoustic sensor configured to detect one or more acoustic signals indicative of an arc fault. The device may include a timer configured to record a duration of the one or more acoustic signals detected by the acoustic sensor and a wireless communication interface configured to transmit an alarm signal when a threshold time has been exceeded. The device may communicate with a sensor hub configured to receive the alarm signal from the sensor device wireless communication interface over a local area connection, and in response to receiving the alarm signal transmit a notification.

20 Claims, 4 Drawing Sheets

ARC FAULT DETECTION USING ULTRASONIC ACOUSTIC SENSORS

CROSS-REFERENCE TO RELATED APPLICATIONS

This application is a continuation of PCT/US2025/038338, filed Jul. 18, 2025, and titled "ARC FAULT DETECTION USING ULTRASONIC ACOUSTIC SENSORS," which claims priority to U.S. Provisional Application No. 63/674,169, filed Jul. 22, 2024, and titled "ARC FAULT DETECTION USING ULTRASONIC ACOUSTIC SENSORS," each of which is hereby incorporated by reference herein in its entirety.

BACKGROUND

Devices may be connected to an electrical circuit to determine when an electrical arc fault is present in the electrical circuit. Electrical wiring may become worn or otherwise damaged leading to an electrical arc fault. An undetected arc fault may lead to hazardous conditions, including fires. When a device detects an electrical arc fault, it may alert a user, for example by sounding an alarm.

SUMMARY

Example embodiments described herein have innovative features, no single one of which is indispensable or solely responsible for their desirable attributes. Without limiting the scope of the claims, some of the advantageous features will now be summarized.

In some aspects, the techniques described herein relate to an arc fault sensing system including: an arc fault sensor device including: an acoustic sensor configured to detect one or more acoustic signals having a frequency in a sensitive range of about 20 kHz to about 60 kHz, wherein the acoustic sensor is sensitive to acoustic signals having a frequency within the sensitive range and is less sensitive to acoustic signals having a frequency outside the sensitive range; a timer configured to record a duration of the one or more acoustic signals detected by the acoustic sensor; a sensor device wireless communication interface in communication with the timer and a sensor hub, and configured to transmit an alarm signal when a threshold time has been exceeded; and a power supply; and the sensor hub including: a sensor hub wireless communication interface configured to receive the alarm signal from the sensor device wireless communication interface over a local area connection, and in response to receiving the alarm signal transmit a notification; and a loudspeaker configured to output an alert notification based on the alarm signal.

The arc fault sensing system of the preceding paragraph can include any sub-combination of at least the following features: where the acoustic sensor includes a bandpass filter configured to attenuate signals having a frequency outside of the sensitive range; where the sensor device wireless communication interface is further configured to transmit the alarm signal for an alert period; where the duration is 5-55 seconds; where the threshold time is 5-55 seconds; where the acoustic sensor is an omnidirectional sensor; where the acoustic sensor is further configured to have a flat frequency response to signals within the sensitive range; where the sensitive range is one of: about 20 kHz to 40 kHz, or 20 kHz to 32 kHz; a non-transitory memory configured to store a log, where the log includes an entry associated with the acoustic sensor detecting an acoustic signal in the sensitive range; where the timer is further configured to reset in response to the acoustic sensor no longer detecting the one or more acoustic signals.

In some aspects, the techniques described herein relate to a method of detecting an electrical arc fault including: positioning an arc fault sensing device in a location unobstructed by an interior construction of a building between the arc fault sensing device and a roof of the building, and wherein the location is further unobstructed by the interior construction of the building between the arc fault sensing device and at least two exterior walls of the building; detecting one or more acoustic signals indicative of an arc fault using the arc fault sensing device, wherein the arc fault sensing device includes an acoustic sensor configured to detect acoustic signals having a frequency in a sensitive range of about 20 kHz to 60 kHz, wherein the acoustic sensor is omnidirectional, and wherein the acoustic sensor is sensitive to acoustic signals having a frequency in the sensitive range and is less sensitive to acoustic signals having a frequency outside the sensitive range; and transmitting an alarm signal using the arc fault sensing device, wherein the arc fault sensing device further includes a wireless communication interface.

The method of detecting an electrical arc fault of the preceding paragraph can include any sub-combination of at least the following features: detecting a location of the electrical arc fault using a portable detector; where the location is an attic of the building; where the one or more acoustic signals are steady-state acoustic signals; determining the one or more acoustic signals are detected by the acoustic sensor for more than a threshold time using a timer of the arc fault sensing device, and where transmitting the alarm signal occurs in response to the one or more acoustic signals being detected for more than the threshold time; determining the one or more acoustic signals are no longer being detected by the acoustic sensor, where the one or more acoustic signals have not been detected for more than the threshold time; and resetting the timer; where the threshold time is 5-55 seconds; where the sensitive range is one of: about 20 kHz to 40 kHz, or 20 kHz to 32 kHz; where the acoustic sensor exhibits a flat frequency response across the sensitive range.

In some aspects, the techniques described herein relate to a handheld sensing device for sensing a location of an electrical arc fault, the handheld sensing device including: an acoustic sensor configured to detect one or more acoustic signals having a frequency in a sensitive range of about 20 kHz to about 60 kHz, wherein the acoustic sensor is sensitive to acoustic signals having a frequency within the sensitive range and attenuates acoustic signals having a frequency outside the sensitive range, wherein the one or more acoustic signals are indicative of the electrical arc fault; an indicator configured to provide an indication of the location of the electrical arc fault to a user of the handheld sensing device, wherein the indication is based on a strength of the detected one or more acoustic signals; and a power supply.

BRIEF DESCRIPTION OF THE DRAWINGS

Embodiments of various inventive features will now be described with reference to the following drawings. Throughout the drawings, reference numbers may be re-used to indicate correspondence between referenced elements. The drawings are provided to illustrate example embodiments described herein and are not intended to limit the scope of the disclosure. To easily identify the discussion of any particular element or act, the most significant digit(s) in a reference number typically refers to the figure number in which that element is first introduced.

DETAILED DESCRIPTION

Figure 1:
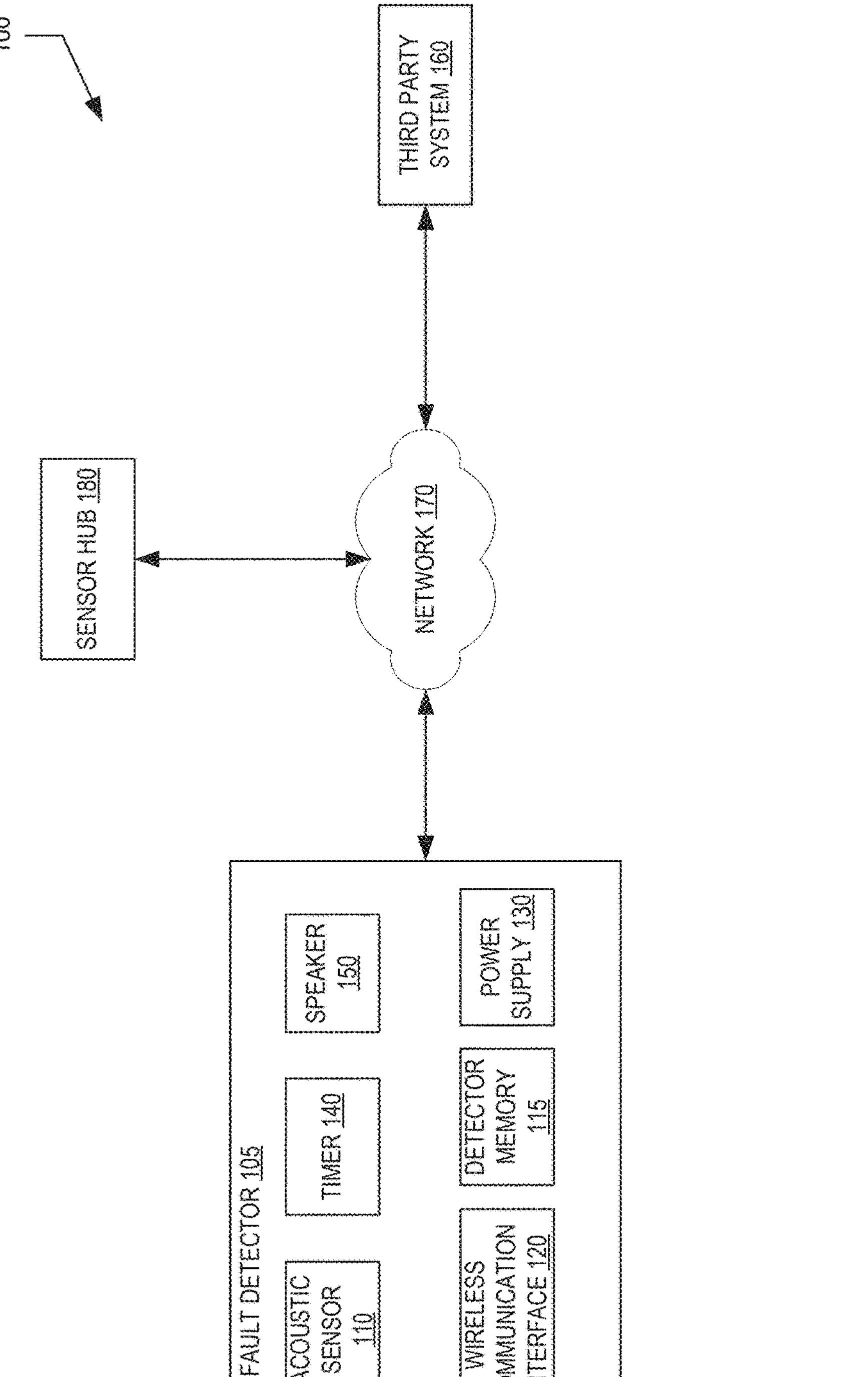
FIG. 1 is a block diagram of an illustrative environment for detecting an arc fault according to some embodiments.

The present disclosure relates to the detection of an electrical arc fault within an area based on an acoustic signal. An electrical arc fault, or arc fault, can occur when the dielectric cover of a wire becomes damaged or degraded (e.g., through physical damage, or degradation over long periods of time), and electrical energy is able to pass between an electrical wire and another component of a structure (e.g., another wire, a wood frame, a metal frame, drywall, etc.). An arc fault may exist within the structure of a building for a long period of time (e.g., several months) before causing an issue. However, this arcing electrical energy between the wire and a component of the structure may eventually lead to a fire, resulting in a significant risk to life and property. Further, arc faults may present significant detection challenges, as the electrical wiring of most buildings is hidden from view within the structure, and may not have been inspected in decades, if ever, following installation.

Some conventional systems allow for the detection of a potential arc fault by connecting a device directly to an electrical circuit, such as an arc fault circuit interrupter. However, arc fault circuit interrupters are relatively new devices, and may existing buildings may not have an arc fault circuit interrupter, or other detection mechanism, connected to the building's electrical system. Additionally, while renovation of a building's electrical system is possible, connecting an arc fault circuit interrupter may not be practical. For example, some buildings may have multiple electrical circuits serving the same building, and identifying separate electrical circuits may be a time-consuming and challenging process that may require destructive access to parts of the building. To address this issue, some arc fault circuit interrupters may be connected directly at an outlet of a building. However, a building may have dozens or hundreds of electrical outlets, and installing an arc fault circuit interrupter at each outlet may be impractical. Further, for an arc fault circuit interrupter to function properly requires proper installation. Installation errors are unavoidable at a large scale, and an improperly installed arc fault circuit interrupter may cause additional risks. Additionally, the installation of arc fault circuit interrupters is time-consuming, and until an arc fault circuit interrupter has been installed for every electrical circuit, the building may still be at risk of an arc fault. Therefore, it is desirable to have a system for detecting arc faults without the need for complex and time-consuming upgrades to the electrical system of a building by the addition of arc fault circuit interrupters.

Some aspects of the present disclosure address some or all of the issues noted above, among others, by providing a system for detecting a potential arc fault within an area. Arc faults emit a characteristic ultrasonic acoustic signal that is not detectable by the human ear, but may be detected using a specialized acoustic transducer configured for the relevant frequency range. As such, a device containing an acoustic transducer sensitive to the relevant frequency range may determine when an arc fault has been detected.

In some embodiments, an arc fault detection device may include the acoustic transducer configured to be sensitive to acoustic signals within the relevant frequency range, and to be less sensitive to acoustic signals outside of the relevant frequency range. The arc fault detection device may further include a timer to determine a length of time for which an acoustic signal has been detected. Use of a timer, and a threshold detection time, may improve the ability of the arc fault detection device to avoid transmitting an alarm signal when no arc fault is present due to a transient noise within the relevant frequency range being detected (e.g., a dog whistle being blown for a short duration). The arc fault detection device may be powered by an internal power source (e.g., a battery), or an external power source (e.g., the power supply of the building being monitored). When the arc fault detection device detects a potential arc fault, the arc fault detection device may transmit an alarm signal to a sensor hub. The sensor hub may enable a network of arc fault detection devices to be used for a single building, such that a single alarm signal for the building may be transmitted from the sensor hub even when two or more arc fault detectors of the building are transmitting an alarm signal to the sensor hub. This may reduce the number of unnecessary alarm signals transmitted from the building (e.g., to a building manager or fire department), reducing confusion by a recipient of the alarm signal.

Further, there may be particular locations within a building where an arc fault detection device is better able to function. Such areas may be those where there is a minimal amount of building material (e.g., studs, drywall, insulation, etc.) separating the arc fault detection device from the building's electrical wiring. Positioning an arc fault detection device within such a location may reduce the number of arc fault detection devices needed to adequately provide detection for a building by improving the ability of the arc fault detection device to detect an acoustic signal indicative of an arc fault.

Additional aspects of the present disclosure relate to a handheld sensing device configured to assist a user in identifying the location of a detected arc fault. The handheld sensing device may have a visual or other indicator configured to indicate to a user a direction or intensity of a detected acoustic signal indicative of an arc fault. The handheld sensing device may have a directional acoustic sensor to aid in identifying the location of a detected arc fault. The directional acoustic sensor aids in identifying the location by detecting an acoustic signal at a higher intensity (e.g., amplitude of the acoustic signal) in the direction of the arc fault, and an acoustic signal at a lower intensity in directions away from the arc fault.

Various aspects of the disclosure will be described with regard to certain examples and embodiments, which are intended to illustrate but not limit the disclosure. Although aspects of some embodiments described in the disclosure will focus, for the purpose of illustration, on particular examples of sensors, timers, electronic components, and the like, the examples are illustrative only and are not intended to be limiting. In some embodiments, the techniques described herein may be applied to additional or alternative types of sensors, timers, electronic components, and the like. Additionally, any feature used in any embodiment described herein may be used in any combination with any other feature or in any other embodiment, without limitation.

Example Arc Fault Detection Environment

With reference to an illustrative example, FIG. 1 shows example environment 100 for implementing an arc fault sensing system to detect an arc fault using an arc fault sensor device (e.g., arc fault detector 105). The environment 100 includes arc fault detector 105, network 170, third party system 160, and sensor hub 180.

The arc fault detector 105 includes an acoustic sensor 110, a detector memory 115, a wireless communication interface 120, a power supply 130, a timer 140, and a speaker 150. The arc fault detector is configured to determine that an acoustic signal detected by the acoustic sensor 110 is likely to indicate the presence of an electrical arc fault within an area (e.g., within a room, a floor of a building, or a building).

The acoustic sensor 110 may be an acoustic transducer configured to detect acoustic signals, and exhibits a substantially flat frequency response within a sensitive range. The sensitive range may include frequencies associated with an electrical arc fault. In some embodiments, the acoustic sensor 110 may be an omnidirectional sensor. Advantageously, an omnidirectional acoustic sensor may allow the arc fault detector to be placed in a greater variety of positions than would be possible with a directional acoustic sensor. The range of frequencies associated with an electrical arc fault, and the sensitive range, may include a range falling between about 20 kHz and about 60 kHz, for example, about 20 kHz to about 40 kHz, about 20 kHz to about 32 kHz, or about 22 kHz to about 32 kHz. Further, the acoustic signal detected by the acoustic sensor 110 may be a steady-state acoustic signal. In some embodiments, the acoustic sensor 110 may implement a bandpass filter to attenuate at least some frequencies outside of the sensitive range. The acoustic sensor 110 may be highly responsive to frequencies within the desired frequency range. The acoustic sensor 110 may also be highly selective, and may be less sensitive to frequencies outside of the desired frequency range. In some embodiments, such as where an alert notification is to be provided without consideration for a length of time an acoustic signal indicative of an arc fault has been detected, the acoustic sensor 110 may transmit an alarm signal to the speaker 150. The speaker 150 may then emit an alert notification in response to receiving the alarm signal.

The wireless communication interface 120 is configured to allow the arc fault detector to communicate with the sensor hub 180, third party system 160, or other device, for example via the network 170. The wireless communication interface 120 may be used to receive and process instructions for the arc fault detector 105. For example, an instruction to update a threshold detection duration of the timer 140 may be received. Additionally, the wireless communication interface 120 may be configured to allow the arc fault detector 105 to transmit a signal to the sensor hub 180 or the third party system 160 when an acoustic signal is detected. For example, an alert signal may be transmitted to the sensor hub 180 or third party system 160 when a threshold detection duration is exceeded. Alternatively, for example where the timer 140 is a part of the sensor hub 180, the arc fault detector 105 may transmit an alarm signal as long as the acoustic sensor 110 detects an acoustic signal indicative of an arc fault.

The power supply 130 may be an internal power supply or an external power supply. An internal power supply may include, for example, a battery, a capacitor, or another source of electrical power, rechargeable or single charge, that may be contained within or coupled to the arc fault detector 105. A fixed power supply may include, for example, a physical or wireless connection to a power supply or other electrical connection of a room, building, or other space in which the arc fault detector is located.

The timer 140 is a timing device or mechanism configured to record a duration during which the acoustic sensor 110 has detected an acoustic signal indicative of an arc fault. The timer 140 may be, for example, a crystal oscillator-based timer, or other electrical timer. The timer 140 may be further configured to generate a signal when a threshold detection duration (e.g., 5 seconds, 30 seconds, 55 seconds, 1 minute, 5 minutes, etc.) has been exceeded. The threshold detection duration may be a static threshold. The static threshold may be set by a manufacturer or seller of the arc fault detector 105. Alternatively, the static threshold may be user-configurable such that a purchaser or user of the arc fault detector 105 can alter the threshold detection duration. The threshold detection duration may be updateable, for example by the arc fault detector 105 receiving an instruction to update the threshold detection duration via the wireless communication interface 120. Alternatively, the threshold detection duration may be dynamic. For example, the threshold detection duration may be determined based on an intensity of the detected acoustic signal (e.g., an amplitude of the acoustic signal). The timer 140 may have a memory used to store a history of durations during which an acoustic signal was detected by the acoustic sensor 110. In some embodiments, the timer 140 may be a part of the sensor hub 180. For example, any detection by the acoustic sensor 110 may cause the arc fault detector 105 to transmit a signal to the sensor hub 180, and the timer 140 as part of the sensor hub 180 may determine a duration of the received signal. The timer 140 may then compare the duration of the received signal to the threshold detection duration to determiner when an alert should be transmitted by the sensor hub 180 (e.g., to the third party system 160 via the network 170). Additionally, the timer 140 may reset when the acoustic sensor 110 no longer detects an acoustic signal indicative of an arc fault. In some embodiments, such as where the arc fault detector 105 is configured to provide an alert notification via the speaker 150, the timer 140 may generate the alarm signal to cause the speaker 150 to provide the alarm notification when the threshold time has been exceeded.

The detector memory 115 may be a non-transitory memory of the arc fault detector 105 configured to store information related to a detection event associated with the detection of an acoustic signal indicative of an arc fault by the acoustic sensor 110. For example, the detector memory 115 may store a log of detection events where the acoustic sensor 110 detects an acoustic signal indicative of an arc fault. The log may be generated based on information from the acoustic sensor 110, the timer 140 or a combination of information from both the acoustic sensor 110 and the timer 140. Each log entry in the log may be associated with the acoustic sensor 110 detecting an acoustic sensor in the sensitive range. Each log entry may further include time information from the timer 140, for example a length of the detection event where an acoustic signal was detected in the sensitive range.

The speaker 150 is configured to emit an alert notification as an audible sound (e.g., a tone, series of tones, human speech, etc.) to alert a user that the arc fault detector 105 has detected a potential arc fault (e.g., based on an alarm signal). The audible sound may be emitted by a loudspeaker. The speaker 150 may be activated, for example, in response to the threshold detection duration of the timer 140 having been exceeded. The speaker 150 may continue to emit an audible sound for a fixed period, until a user provides an indication to silence the speaker 150 (e.g., by directly interacting with the arc fault detector 105 or by transmitting an instruction to the arc fault detector 105 via the wireless communication interface 120). In some embodiments, the speaker 150 may be a part of the sensor hub 180, and the speaker 150 may output an alert notification from the sensor hub 180 when the sensor hub 180 receives an alarm signal from an arc fault detector 105.

The network 170 may be a private or publicly-accessible network. The network 170 may be a set of linked networks, some or all of which may be operated by various distinct parties, for example the Internet. In some cases, network 170 may include a private network, personal area network, local area network, wide area network, cellular data network, satellite network, etc., or some combination thereof, some or all of which may or may not have access to and/or from the Internet.

The third party system 160 may be a computing device associated with a user of the arc fault detector 105 or with a responder that will initiate a corrective action related to a detected arc fault. For example, the third party system 160 may be a computing device associated with a maintenance provider for a building, and the third party system 160 may be configured to indicate to the maintenance provider that an arc fault has been detected. Alternatively, the third party system 160 may be associated with a building owner or manager in order to alert the owner or manager that additional action is required to address a potential arc fault.

Figure 2:
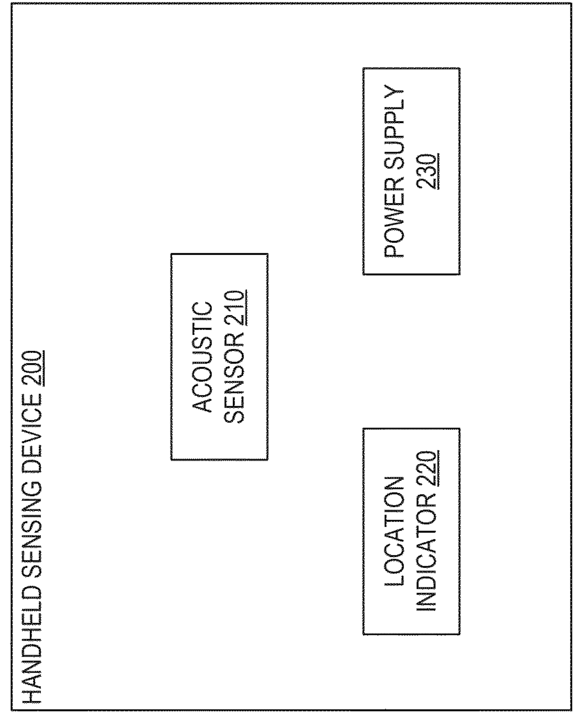
FIG. 2 is a block diagram of illustrative handheld arc fault sensing device according to some embodiments.

The sensor hub 180 is a device configured to facilitate communication between one or more arc fault detectors 105, a third party system 160, and in some embodiments may further communicate with the handheld sensing device 200 described in relation to FIG. 2. The sensor hub 180 may receive an alarm signal from the arc fault detector 105 indicating that an arc fault has been detected, for example via a sensor hub wireless communication interface in communication with the wireless communication interface 120 of the arc fault detector 105 via the network 170 (e.g., a local area connection). In some embodiments, the sensor hub 180 may contain a timer, similar to the timer 140.

Where two or more arc fault detector 105 are in communication with the sensor hub 180, the duration the timer measures may be based on signals received from the two or more arc fault detectors 105. For example, if the threshold detection duration is 30 seconds, the sensor hub 180 may receive an alarm signal from a first arc fault detector 105 for 20 seconds. The alarm signal from the first arc fault detector 105 may then stop. The sensor hub 180 may then have a continuation threshold during which two alarm signals, separated by a pause between the alarm signals, which when not exceeded indicates to the sensor hub 180 that the two alarm signals are connected. The sensor hub 180 in this example may then receive a second alarm signal from a second arc fault detector 105 within this continuation threshold, and continue to count the duration of the alarm signal using the timer of the sensor hub 180. When the combined alarm signal duration from the first arc fault detector 105 and the second arc fault detector 105 exceeds the detection duration threshold, the sensor hub 180 may transmit a second alarm signal to the third party system 160 to indicate that an arc fault has been detected. While two arc fault detectors 105 have been discussed in this example, any number of arc fault detectors 105 may be in communication with the sensor hub 180. Additionally, the sensor hub 180 may be implemented on a computing device (e.g., the computing device 400 of FIG. 4) and some or all of the functionality described herein may be implemented by computer-executable instructions of the computing device implementing the sensor hub 180.

Example Handheld Sensing Device

With reference to an illustrative example, FIG. 2 shows a block diagram of an example handheld sensing device 200 for detecting an arc fault. The handheld sensing device 200 may be a portable detector device, and includes an acoustic sensor 210, a location indicator 220, and a power supply 230. In some embodiments, the handheld sensing device 200 may be implemented using a portable computing device 400, and certain functions described herein may be achieved by executing computer-executable instructions on a processor of the computing device 400.

The acoustic sensor 210 may be an acoustic transducer configured to detect acoustic signals, and has a substantially flat frequency response within a range of frequencies associated with an electrical arc fault. The range of frequencies associated with an electrical arc fault may include a range falling between 20 kHz and 60 kHz, for example, 20 kHz to 40 kHz, or 20 kHz to 32 kHz, as described with reference to acoustic sensor 110 in FIG. 1. The term ‘substantially flat’ indicates that the frequency response remains relatively consistent within the specified ranges, with minor variations, compared to significantly lower responses outside these ranges. The acoustic sensor 210 of the handheld sensing device 200 may further be configured to determine an intensity of a detected acoustic signal, for example based on an amplitude of the detected acoustic signal. The acoustic sensor 210 may be a directional acoustic sensor 210, such that directing the handheld sensing device 200 differently will alter the strength of the acoustic signal detected by the acoustic sensor 210. Such directional detection may assist in allowing the handheld sensing device 200 to direct a user towards an arc fault. For example, if a user points the handheld sensing device 200 in a first direction, the acoustic signal may have a first intensity. The user may then point the handheld device in a second direction, where the acoustic signal has a second intensity. The difference between the intensity of the first acoustic signal and the second acoustic signal detected by the acoustic sensor 210 may then be used to assist in indicating the direction of the detected arc fault.

The location indicator 220 is configured to indicate a direction, location, distance, or other information useful for identifying the location of an arc fault detected by the acoustic sensor 210. For example, the location indicator 220 may be two or more light-emitting elements (e.g., LEDs) used to indicate a strength of the acoustic signal detected by the acoustic sensor 210. By illuminating additional lights as the strength of the signal increases, the location indicator 220 may indicate a relative distance between the handheld sensing device 200 and the detected arc fault. In another example, the location indicator 220 may be a speaker, and an intensity (e.g., volume) of a sound, tone of a sound, or voice message, emitted by the speaker may change in response to a change in the intensity of the acoustic signal detected by the acoustic sensor 210. In a further example, a display (e.g., an LCD, LED, or other display device) may indicate a direction of the arc fault. A user may point the handheld sensing device in multiple directions, and the display may indicate the direction where the acoustic signal was detected at the highest intensity. Each of these examples may be used alone or in combination with each other to provide a location indicator 220.

The power supply 230 may be an internal power supply. An internal power supply may include, for example, a battery, a capacitor, or another source of electrical power, rechargeable or single charge, that may be contained within or coupled to the handheld sensing device 200. While the power supply 230 is shown in this example as being contained within the handheld sensing device 200, the power supply 230 may be located externally to the handheld sensing device 200, for example as a battery pack connected by a wire to the handheld sensing device 200.

Example Arc Fault Detection Routine

Figure 4:
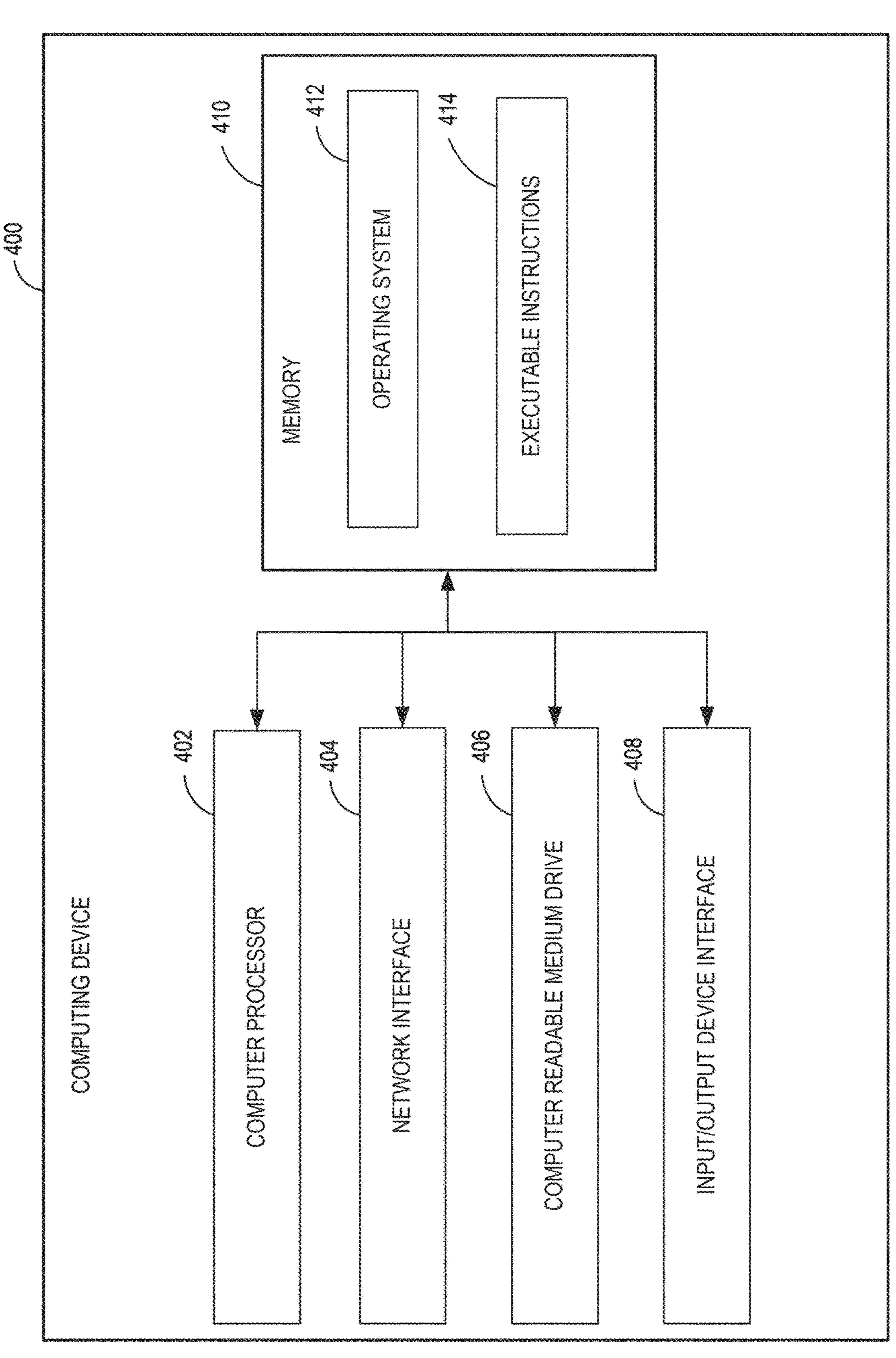
FIG. 4 is a block diagram of an illustrative computing system configured to implement certain aspects of the present disclosure according to some embodiments.

When routine 300 is initiated, a set of executable program instructions stored on one or more non-transitory computer-readable media (e.g., hard drive, flash memory, removable media, etc.) may be loaded into memory (e.g., random access memory or RAM) of a computing device, such as the memory of the computing device 400 shown in FIG. 4, and executed by one or more processors. In some embodiments, the routine 300, or portions thereof, may be implemented on multiple processors, serially or in parallel. The routine 300, or portions thereof, may be implemented without the need for executable program instructions to cause a device to perform portions of the routine 300.

Figure 3:
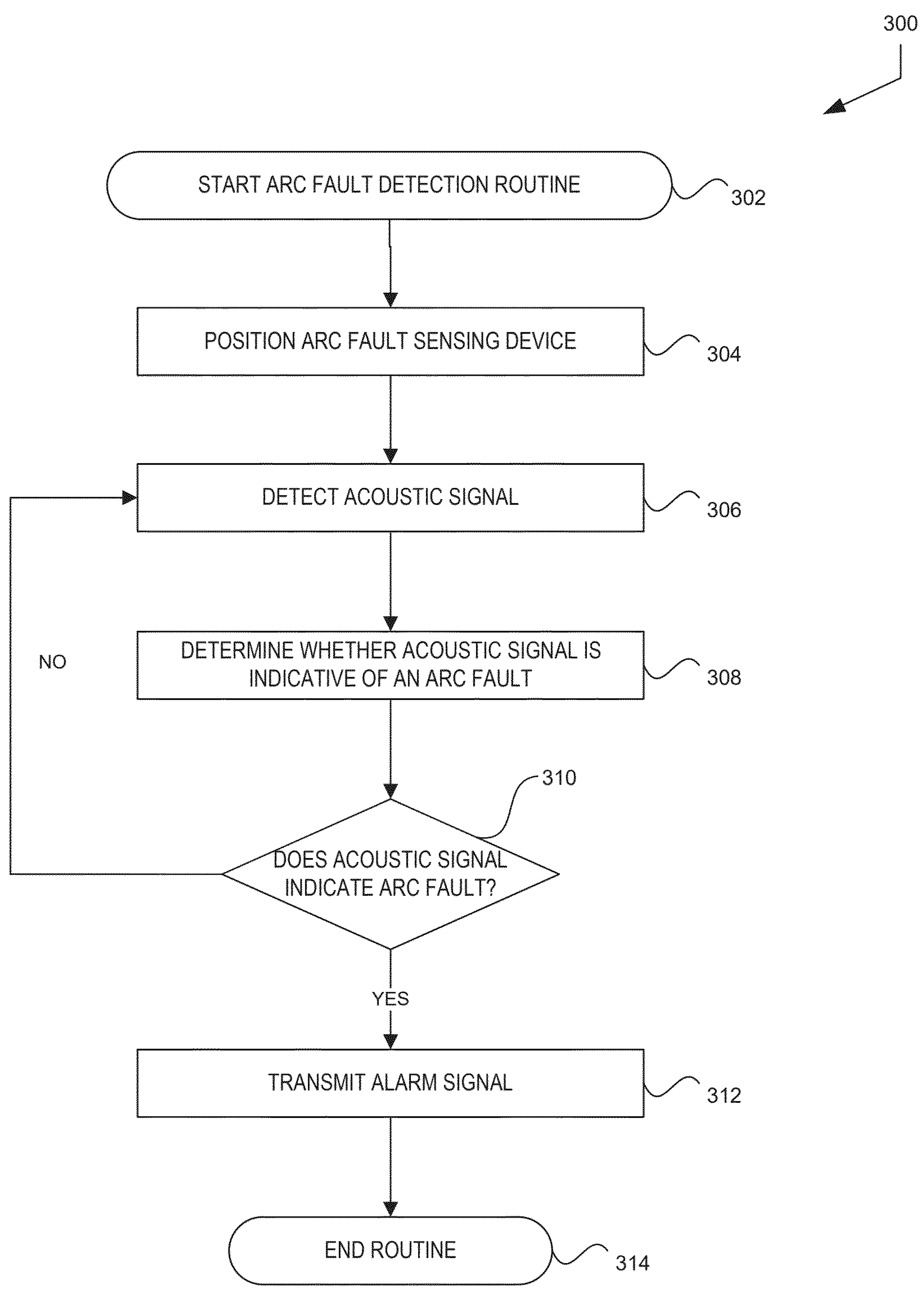
FIG. 3 is a flow diagram of an illustrative routine for detecting a potential arc fault according to some embodiments.

FIG. 3 illustrates example routine 300 for detecting a potential arc fault. The routine 300 begins at block 302, for example in response to a user activating a arc fault detector 105 for use alone or as part of a network of arc fault detectors.

At block 304, the arc fault detector 105 is positioned in a location within an area where arc fault detection is desired. The position of the arc fault detector 105 may be determined based on minimizing an interference with an acoustic signal to be detected by the arc fault detector 105. Minimizing interference may include identifying a location unobstructed by the interior construction of the building where the arc fault detector 105 will be placed. An unobstructed location may, for example, refer to a location having a minimal amount, or no, building material (e.g., drywall, wood, metal, insulation, etc.) in between the location of the arc fault detector 105 and at least two exterior walls of the building where the arc fault detector 105 will be placed. The unobstructed location may further be a location having a minimal amount, or no, building material between the location of the arc fault detector 105 and a roof of the building. An example of such a location is an attic of a building, where there is a higher likelihood that building materials between the electrical wiring and the open space of the interior will be minimized as the attic is less likely to contain drywall or other building materials. Advantageously, such positioning may improve the ability of the arc fault detector 105 to detect an acoustic signal indicative of an arc fault, improving the safety of occupants of the area the arc fault detector 105 is intended to monitor. Additionally, positioning of the arc fault detector 105 may be based in part on the location of a second arc fault detector 105 within the area to be monitored.

At block 306, the arc fault detector 105 detects an acoustic signal by the acoustic sensor 110 that may be indicative of an arc fault. The acoustic signal may be, for example, within a frequency range of 20 kHz to 60 kHz, 20 kHz to 40 kHz, or any range of frequencies detectable by the acoustic sensor 110 of the arc fault detector 105.

At block 308, the arc fault detector 105 determines whether the acoustic signal detected by the acoustic sensor 110 is indicative of an arc fault. For example, the timer 140 of the arc fault detector 105 may have a threshold detection duration for detecting an acoustic signal beyond which, if an acoustic is still detected by the acoustic sensor 110, the timer 140 determines that the acoustic signal is indicative of an arc fault. Alternatively, as described in relation to the sensor hub 180 above herein, the timer may be located in the sensor hub 180. In such embodiments, the sensor hub 180 may then determine when the threshold detection duration has been exceeded by an alarm signal received from the wireless communication interface 120 of one or more arc fault detectors 105.

If the acoustic signal detected by the arc fault detector 105 is indicative of an arc fault, then at decision block 310 the routine 300 proceeds to block 312. If the acoustic signal detected by the arc fault detector 105 is determined not to be indicative of an arc fault, the routine 300 returns to block 306. Where the determination of whether the signal is indicative of an arc fault is based at least in part on the timer 140 of the arc fault detector 105, the arc fault detector 105 may reset the timer 140 (e.g., set a current measured time to zero). Alternatively, the timer 140 may store a current time value, and pause the counting of additional time for a set period (e.g., 5 seconds, 2 minutes, etc.) such that if an acoustic signal indicative of an arc fault is detected within the set period, the timer continues from the previous time value.

At block 312, the arc fault detector 105 transmits an alarm signal. The arc fault detector 105 may transmit the alarm signal by causing the arc fault detector 105 of the arc fault detector 105 to emit a sound. The sound may include a tone, speech, or other audible indication that may alert a user of a potential electrical arc fault. The alarm signal may also be a data signal transmitted by the arc fault detector 105 using the wireless communication interface 120 to an electronic device, such as a computing device. For example, the wireless communication interface 120 may transmit a digital signal containing a message that indicates that an electrical arc fault has been detected. The wireless communication interface 120 may transmit the signal via the network 170 to a third party system 160, or to the sensor hub 180. The signal may include additional information, for example location information indicating a location of the arc fault detector 105 from which the signal is being sent in order to aide in locating the electrical arc fault (e.g., where the arc fault detector 105 is one of a plurality of arc fault detectors in communication with a sensor hub 180 to monitor a building). When the signal is transmitted to the sensor hub 180, the sensor hub 180 may, in response to the signal, act as a relay and retransmit the signal to a third party system 160 via the network 170. In some embodiments, the sensor hub 180 may include additional information (e.g., location information, a device identifier, etc.) that may be useful in locating the detected electrical arc fault. Additionally, transmitting the signal by the arc fault detector 105 may cause a user to use the handheld sensing device 200 to further assist in locating the electrical arc fault. When the arc fault detector 105 has transmitted the alarm signal, the routine 300 moves to block 314 and ends.

Execution Environment

FIG. 4 illustrates various components of an example computing device 400 configured to implement various functionality described herein.

In some embodiments, the computing device 400 may be implemented using any of a variety of computing devices, such as server computing devices, desktop computing devices, personal computing devices, mobile computing devices, mainframe computing devices, midrange computing devices, host computing devices, or some combination thereof.

In some embodiments, the features and services provided by the computing device 400 may be implemented as web services consumable via one or more communication networks. In further embodiments, the computing device 400 is provided by one or more virtual machines implemented in a hosted computing environment. The hosted computing environment may include one or more rapidly provisioned and released computing resources, such as computing devices, networking devices, and/or storage devices. A hosted computing environment may also be referred to as a "cloud" computing environment.

In some embodiments, as shown, a computing device 400 may include: one or more computer processors 402, such as physical central processing units ("CPUs"); one or more network interfaces 404, such as a network interface cards ("NICs"); one or more computer readable medium drives 406, such as a high density disk ("HDDs"), solid state drives ("SSDs"), flash drives, and/or other persistent non-transitory computer readable media; one or more input/output device interfaces 408; and one or more computer-readable memories 410, such as random access memory ("RAM") and/or other volatile non-transitory computer readable media.

The computer-readable memory 410 may include computer program instructions that one or more computer processors 402 execute and/or data that the one or more computer processors 402 use in order to implement one or more embodiments. For example, the computer-readable memory 410 can store an operating system 412 to provide general administration of the computing device 400. As another example, the computer readable memory 410 can store model training module 132. As another example, the computer-readable memory 1310 can store a executable instructions 414.

Terminology

All of the methods and tasks described herein may be performed and fully automated by a computer system. The computer system may, in some cases, include multiple distinct computers or computing devices (e.g., physical servers, workstations, storage arrays, cloud computing resources, etc.) that communicate and interoperate over a network to perform the described functions. Each such computing device typically includes a processor (or multiple processors) that executes program instructions or modules stored in a memory or other non-transitory computer-readable storage medium or device (e.g., solid state storage devices, disk drives, etc.). The various functions disclosed herein may be embodied in such program instructions, or may be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips or magnetic disks, into a different state. In some embodiments, the computer system may be a cloud-based computing system whose processing resources are shared by multiple distinct business entities or other users.

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or combinations of electronic hardware and computer software. To clearly illustrate this interchangeability, various illustrative components, blocks, modules, and steps have been described above generally in terms of their functionality. Whether such functionality is implemented as hardware, or as software that runs on hardware, depends upon the particular application and design conditions imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

Examples of embodiments of the present disclosure can be described in view of the following clauses:

Clause 1. An arc fault sensing system comprising:

an arc fault sensor device comprising:

an acoustic sensor configured to detect one or more acoustic signals having a frequency in a sensitive range of about 20 kHz to about 60 kHz, wherein the acoustic sensor is sensitive to acoustic signals having a frequency within the sensitive range and is less sensitive to acoustic signals having a frequency outside the sensitive range;

a timer configured to record a duration of the one or more acoustic signals detected by the acoustic sensor;

a sensor device wireless communication interface in communication with the timer and a sensor hub, and configured to transmit an alarm signal when a threshold time has been exceeded; and a power supply; and the sensor hub comprising:

a sensor hub wireless communication interface configured to receive the alarm signal from the sensor device wireless communication interface over a local area connection, and in response to receiving the alarm signal transmit a notification; and a loudspeaker configured to output an alert notification based on the alarm signal.

Clause 2. The arc fault sensing system of clause 1, wherein the acoustic sensor comprises a bandpass filter configured to attenuate signals having a frequency outside of the sensitive range.

Clause 3. The arc fault sensing system of clause 1, wherein the sensor device wireless communication interface is further configured to transmit the alarm signal for an alert period.

Clause 4. The arc fault sensing system of clause 3, wherein the duration is 5-55 seconds.

Clause 5. The arc fault sensing system of clause 1, wherein the threshold time is 5-55 seconds.

Clause 6. The arc fault sensing system of clause 1, wherein the acoustic sensor is an omnidirectional sensor.

Clause 7. The arc fault sensing system of clause 1, wherein the acoustic sensor is further configured to have a flat frequency response to signals within the sensitive range.

Clause 8. The arc fault sensing system of clause 1, wherein the sensitive range is one of: about 20 kHz to 40 kHz, or 20 kHz to 32 kHz.

Clause 9. The arc fault sensing system of clause 1 further comprising a non-transitory memory configured to store a log, wherein the log comprises an entry associated with the acoustic sensor detecting an acoustic signal in the sensitive range.

Clause 10. The arc fault sensing system of clause 1, wherein the timer is further configured to reset in response to the acoustic sensor no longer detecting the one or more acoustic signals.

Clause 11. A method of detecting an electrical arc fault comprising:

positioning an arc fault sensing device in a location unobstructed by an interior construction of a building between the arc fault sensing device and a roof of the building, and wherein the location is further unobstructed by the interior construction of the building between the arc fault sensing device and at least two exterior walls of the building;

detecting one or more acoustic signals indicative of an arc fault using the arc fault sensing device, wherein the arc fault sensing device comprises an acoustic sensor configured to detect acoustic signals having a frequency in a sensitive range of about 20 kHz to 60 kHz, wherein the acoustic sensor is omnidirectional, and wherein the acoustic sensor is sensitive to acoustic signals having a frequency in the sensitive range and is less sensitive to acoustic signals having a frequency outside the sensitive range; and transmitting an alarm signal using the arc fault sensing device, wherein the arc fault sensing device further comprises a wireless communication interface.

Clause 12. The method of detecting the electrical arc fault of clause 11 further comprising detecting a location of the electrical arc fault using a portable detector.

Clause 13. The method of detecting the electrical arc fault of clause 11 wherein the location is an attic of the building.

Clause 14. The method of detecting the electrical arc fault of clause 11, wherein the one or more acoustic signals are steady-state acoustic signals.

Clause 15. The method of detecting the electrical arc fault of clause 11 further comprising determining the one or more acoustic signals are detected by the acoustic sensor for more than a threshold time using a timer of the arc fault sensing device, and wherein transmitting the alarm signal occurs in response to the one or more acoustic signals being detected for more than the threshold time.

Clause 16. The method of detecting the electrical arc fault of clause 15 further comprising:

determining the one or more acoustic signals are no longer being detected by the acoustic sensor, wherein the one or more acoustic signals have not been detected for more than the threshold time; and resetting the timer.

Clause 17. The method of detecting the electrical arc fault of clause 15, wherein the threshold time is 5-55 seconds.

Clause 18. The method of detecting the electrical arc fault of clause 11, wherein the sensitive range is one of: about 20 kHz to 40 kHz, or 20 kHz to 32 kHz.

Clause 19. The method of detecting the electrical arc fault of clause 11, wherein the acoustic sensor exhibits a flat frequency response across the sensitive range.

Clause 20. A handheld sensing device for sensing a location of an electrical arc fault, the handheld sensing device comprising:

an acoustic sensor configured to detect one or more acoustic signals having a frequency in a sensitive range of about 20 kHz to about 60 kHz, wherein the acoustic sensor is sensitive to acoustic signals having a frequency within the sensitive range and attenuates acoustic signals having a frequency outside the sensitive range, wherein the one or more acoustic signals are indicative of the electrical arc fault;

an indicator configured to provide an indication of the location of the electrical arc fault to a user of the handheld sensing device, wherein the indication is based on a strength of the detected one or more acoustic signals; and a power supply.

What is claimed is:

1. An arc fault sensing system comprising:

an arc fault sensor device comprising:

a non-contact acoustic sensor configured to detect one or more acoustic signals having a frequency in a sensitive range of 20 kHz to 60 kHz, wherein the acoustic sensor is sensitive to acoustic signals having a frequency within the sensitive range and is less sensitive to acoustic signals having a frequency outside the sensitive range;

a timer configured to record a duration of the one or more acoustic signals detected by the acoustic sensor;

a sensor device wireless communication interface in communication with the timer and a sensor hub, and configured to transmit an alarm signal when a threshold time has been exceeded; and a power supply; and the sensor hub comprising:

a sensor hub wireless communication interface configured to receive the alarm signal from the sensor device wireless communication interface over a local area connection, and in response to receiving the alarm signal transmit a notification; and a loudspeaker configured to output an alert notification based on the alarm signal.

2. The arc fault sensing system of claim 1, wherein the acoustic sensor comprises a bandpass filter configured to attenuate signals having a frequency outside of the sensitive range.

3. The arc fault sensing system of claim 1, wherein the sensor device wireless communication interface is further configured to transmit the alarm signal for an alert period.

4. The arc fault sensing system of claim 3, wherein the duration is 5-55 seconds.

5. The arc fault sensing system of claim 1, wherein the threshold time is 5-55 seconds.

6. The arc fault sensing system of claim 1, wherein the acoustic sensor is an omnidirectional sensor.

7. The arc fault sensing system of claim 1, wherein the acoustic sensor is further configured to have a flat frequency response to signals within the sensitive range.

8. The arc fault sensing system of claim 1, wherein the sensitive range is one of: 20 kHz to 40 kHz, or 20 kHz to 32 kHz.

9. The arc fault sensing system of claim 1 further comprising a non-transitory memory configured to store a log, wherein the log comprises an entry associated with the acoustic sensor detecting an acoustic signal in the sensitive range.

10. The arc fault sensing system of claim 1, wherein the timer is further configured to reset in response to the acoustic sensor no longer detecting the one or more acoustic signals.

11. A method of detecting an electrical arc fault comprising:

positioning an arc fault sensing device in a location unobstructed by an interior construction of a building between the arc fault sensing device and a roof of the building, and wherein the location is further unobstructed by the interior construction of the building between the arc fault sensing device and at least two exterior walls of the building;

detecting one or more acoustic signals indicative of an arc fault using the arc fault sensing device, wherein the arc fault sensing device comprises a non-contact acoustic sensor configured to detect acoustic signals having a frequency in a sensitive range of 20 kHz to 60 kHz, wherein the acoustic sensor is omnidirectional, and wherein the acoustic sensor is sensitive to acoustic signals having a frequency in the sensitive range and is less sensitive to acoustic signals having a frequency outside the sensitive range; and transmitting an alarm signal using the arc fault sensing device, wherein the arc fault sensing device further comprises a wireless communication interface.

12. The method of detecting the electrical arc fault of claim 11 further comprising detecting a location of the electrical arc fault using a portable detector.

13. The method of detecting the electrical arc fault of claim 11 wherein the location is an attic of the building.

14. The method of detecting the electrical arc fault of claim 11, wherein the one or more acoustic signals are steady-state acoustic signals.

15. The method of detecting the electrical arc fault of claim 11 further comprising determining the one or more acoustic signals are detected by the acoustic sensor for more than a threshold time using a timer of the arc fault sensing device, and wherein transmitting the alarm signal occurs in response to the one or more acoustic signals being detected for more than the threshold time.

16. The method of detecting the electrical arc fault of claim 15 further comprising:

determining the one or more acoustic signals are no longer being detected by the acoustic sensor, wherein the one or more acoustic signals have not been detected for more than the threshold time; and resetting the timer.

17. The method of detecting the electrical arc fault of claim 15, wherein the threshold time is 5-55 seconds.

18. The method of detecting the electrical arc fault of claim 11, wherein the sensitive range is one of: 20 kHz to 40 kHz, or 20 kHz to 32 kHz.

19. The method of detecting the electrical arc fault of claim 11, wherein the acoustic sensor exhibits a flat frequency response across the sensitive range.

20. A handheld sensing device for sensing a location of an electrical arc fault, the handheld sensing device comprising:

a non-contact acoustic sensor configured to detect one or more acoustic signals having a frequency in a sensitive range of 20 kHz to 60 kHz, wherein the acoustic sensor is sensitive to acoustic signals having a frequency within the sensitive range and attenuates acoustic signals having a frequency outside the sensitive range, wherein the one or more acoustic signals are indicative of the electrical arc fault;

an indicator configured to provide an indication of the location of the electrical arc fault to a user of the handheld sensing device, wherein the indication is based on a strength of the detected one or more acoustic signals; and a power supply.

* * * * *